US006606039B2

(12) United States Patent
Hirano et al.

(10) Patent No.: US 6,606,039 B2
(45) Date of Patent: Aug. 12, 2003

(54) HUFFMAN ENCODER, HUFFMAN ENCODING METHOD AND RECORDING MEDIUM HAVING PROGRAM FOR HUFFMAN ENCODING PROCESS RECORDED THEREON

(75) Inventors: Kenji Hirano, Sakai (JP); Shigeru Sakon, Osaka (JP)

(73) Assignee: Kanebo, Limited, Tokyo (JP)

( * ) Notice: Subject to any disclaimer, the term of this patent is extended or adjusted under 35 U.S.C. 154(b) by 0 days.

(21) Appl. No.: 09/774,922

(22) Filed: Jan. 31, 2001

(65) Prior Publication Data

US 2001/0011959 A1 Aug. 9, 2001

(30) Foreign Application Priority Data

Feb. 1, 2000 (JP) ........................................ 2000-023480

(51) Int. Cl.[7] ................................................ H03M 7/40
(52) U.S. Cl. ............................ 341/65; 341/63; 341/60; 341/50; 382/232; 358/432
(58) Field of Search ............................. 341/65, 50, 60, 341/63, 200; 382/239, 232, 233; 358/433; 348/220; 375/240.03, 240.2

(56) References Cited

U.S. PATENT DOCUMENTS

| 4,901,075 | A | | 2/1990 | Vogel ........................ 341/63 |
| 4,908,862 | A | * | 3/1990 | Kaneko et al. ............... 341/60 |
| 5,006,930 | A | | 4/1991 | Stroppiana et al. ......... 341/200 |
| 5,086,488 | A | * | 2/1992 | Kato et al. .................. 382/239 |
| 5,335,016 | A | * | 8/1994 | Nakagawa .................. 348/220 |
| 5,629,779 | A | | 5/1997 | Jeon .......................... 358/432 |
| 5,732,156 | A | * | 3/1998 | Watanabe et al. ........... 382/239 |
| 5,754,698 | A | * | 5/1998 | Suzuki et al. ............... 382/232 |
| 5,875,039 | A | * | 2/1999 | Ohsawa et al. ............. 358/433 |
| 6,175,594 | B1 | * | 1/2001 | Strasser et al. .......... 375/240.2 |
| 6,385,343 | B1 | * | 5/2002 | Kuroda et al. .............. 382/233 |

FOREIGN PATENT DOCUMENTS

| JP | 3-55987 | 3/1991 |
| JP | 3-89779 | 4/1991 |
| JP | 3-204290 | 5/1991 |
| JP | 7-222154 | 8/1995 |

* cited by examiner

Primary Examiner—Jean Bruner Jeanglaude
(74) Attorney, Agent, or Firm—Morgan & Finnegan, LLP

(57) ABSTRACT

A Huffman encoder and a method for Huffman encoding in which a data compression rate can be easily changed and a recording medium having a program for a Huffman encoding process recorded thereon. A quantizer quantizes DCT coefficients output by a DCT device to output quantized DCT coefficients. A comparator judges a quantized DCT coefficient to be an invalid coefficient when the absolute value of the DCT coefficient is equal to or smaller than a threshold and judges the quantized DCT coefficient to be a valid coefficient when the absolute value of the DCT coefficient is greater than the threshold. A run length counter counts the number of consecutive invalid coefficients to output run lengths and outputs valid coefficients. An encoder performs encoding based on the valid coefficients and the run lengths to output encoded data.

25 Claims, 13 Drawing Sheets

FIG. 2

[TABLE OF HUFFMAN CODES FOR AC COEFFICIENTS]

| RL/SSSS | CODE LENGTH | HUFFMAN CODE |
|---|---|---|
| 0/0(EOB) | 4 | 1010 |
| 0/1 | 2 | 00 |
| 0/2 | 2 | 01 |
| 0/3 | 3 | 100 |
| 0/4 | 4 | 1011 |
| 0/5 | 5 | 11010 |
| 0/6 | 7 | 1111000 |
| 0/7 | 8 | 11111000 |
| 0/8 | 10 | 1111110110 |
| 0/9 | 16 | 1111111110000010 |
| 0/A | 16 | 1111111110000011 |
| 1/1 | 4 | 1100 |
| 1/2 | 5 | 11011 |
| 1/3 | 7 | 1111001 |
| 1/4 | 9 | 111110110 |
| 1/5 | 11 | 11111110110 |
| 1/6 | 16 | 1111111110000100 |
| 1/7 | 16 | 1111111110000101 |
| 1/8 | 16 | 1111111110000110 |
| 1/9 | 16 | 1111111110000111 |
| 1/A | 16 | 1111111110001000 |
| F/0(ZRL) | 11 | 11111111001 |
| F/1 | 16 | 1111111111110101 |
| F/2 | 16 | 1111111111110110 |
| F/3 | 16 | 1111111111110111 |
| F/4 | 16 | 1111111111111000 |
| F/5 | 16 | 1111111111111001 |
| F/6 | 16 | 1111111111111010 |
| F/7 | 16 | 1111111111111011 |
| F/8 | 16 | 1111111111111100 |
| F/9 | 16 | 1111111111111101 |
| F/A | 16 | 1111111111111110 |

[ZIGZAG SCAN]

FIG. 12 PRIOR ART

[TABLE OF HUFFMAN CODES FOR DC COEFFICIENTS]

| SSSS | CODE LENGTH | HUFFMAN CODE |
|------|-------------|--------------|
| 0 | 2 | 00 |
| 1 | 3 | 010 |
| 2 | 3 | 011 |
| 3 | 3 | 100 |
| 4 | 3 | 101 |
| 5 | 3 | 110 |
| 6 | 4 | 1110 |
| 7 | 5 | 11110 |
| 8 | 6 | 111110 |
| 9 | 7 | 1111110 |
| 10 | 8 | 11111110 |
| 11 | 9 | 111111110 |

F I G. 1 3  PRIOR ART

[TABLE OF HUFFMAN CODES FOR AC COEFFICIENTS]

| NNNN/SSSS | CODE LENGTH | HUFFMAN CODE |
|---|---|---|
| 0/0(EOB) | 4 | 1010 |
| 0/1 | 2 | 00 |
| 0/2 | 2 | 01 |
| 0/3 | 3 | 100 |
| 0/4 | 4 | 1011 |
| 0/5 | 5 | 11010 |
| 0/6 | 7 | 1111000 |
| 0/7 | 8 | 11111000 |
| 0/8 | 10 | 1111110110 |
| 0/9 | 16 | 1111111110000010 |
| 0/A | 16 | 1111111110000011 |
| 1/1 | 4 | 1100 |
| 1/2 | 5 | 11011 |
| 1/3 | 7 | 1111001 |
| 1/4 | 9 | 111110110 |
| 1/5 | 11 | 11111110110 |
| 1/6 | 16 | 1111111110000100 |
| 1/7 | 16 | 1111111110000101 |
| 1/8 | 16 | 1111111110000110 |
| 1/9 | 16 | 1111111110000111 |
| 1/A | 16 | 1111111110001000 |
| F/0(ZRL) | 11 | 11111111001 |
| F/1 | 16 | 1111111111110101 |
| F/2 | 16 | 1111111111110110 |
| F/3 | 16 | 1111111111110111 |
| F/4 | 16 | 1111111111111000 |
| F/5 | 16 | 1111111111111001 |
| F/6 | 16 | 1111111111111010 |
| F/7 | 16 | 1111111111111011 |
| F/8 | 16 | 1111111111111100 |
| F/9 | 16 | 1111111111111101 |
| F/A | 16 | 1111111111111110 |

FIG. 14 PRIOR ART

QUANTIZATION COEFFICIENT $Q_{UV}$

| 16 | 11 | 10 | 16 | 24 | 40 | 51 | 61 |
|---|---|---|---|---|---|---|---|
| 12 | 12 | 14 | 19 | 26 | 58 | 60 | 55 |
| 14 | 13 | 16 | 24 | 40 | 57 | 69 | 56 |
| 14 | 17 | 22 | 29 | 51 | 87 | 80 | 62 |
| 18 | 22 | 37 | 56 | 68 | 109 | 103 | 77 |
| 24 | 35 | 55 | 64 | 81 | 104 | 113 | 92 |
| 49 | 64 | 78 | 87 | 103 | 121 | 120 | 101 |
| 72 | 92 | 95 | 98 | 112 | 100 | 103 | 99 |

DCT COEFFICIENT $S_{UV}$

| 260 | 48 | -16 | 5 | 2 | 4 | 0 | 1 |
|---|---|---|---|---|---|---|---|
| -79 | 36 | -2 | -7 | 1 | -3 | -1 | -2 |
| 0 | -8 | 3 | -2 | -2 | 1 | 5 | 1 |
| -8 | -4 | 5 | -4 | 1 | 7 | 6 | -2 |
| -2 | -6 | -1 | 0 | -4 | -1 | 0 | -1 |
| -3 | -2 | -1 | -1 | 1 | 2 | -5 | -1 |
| -4 | -1 | 1 | 1 | 0 | -2 | 2 | 0 |
| 1 | 1 | 1 | 1 | -1 | 1 | 0 | 0 |

$\gamma_{UV} = \text{round}(S_{UV}/Q_{UV})$

QUANTIZED DCT COEFFICIENT $\gamma_{UV}$

| 16 | 4 | -2 | 0 | 0 | 0 | 0 | 0 |
|---|---|---|---|---|---|---|---|
| -7 | 3 | 0 | 0 | 0 | 0 | 0 | 0 |
| 0 | -1 | 0 | 0 | 0 | 0 | 0 | 0 |
| -1 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

COUNT NUMBER OF "0" → 54

| RUN LENGTH | — | 0 | 0 | 1 | 0 | 2 | 0 |
|---|---|---|---|---|---|---|---|
| VALID COEFFICIENT | 16 | 4 | -7 | 3 | -2 | -1 | -1 |

HUFFMAN ENCODER, HUFFMAN ENCODING METHOD AND RECORDING MEDIUM HAVING PROGRAM FOR HUFFMAN ENCODING PROCESS RECORDED THEREON

BACKGROUND OF THE INVENTION

1. Field of the Invention

The present invention relates to a Huffman encoder, a method for Huffman encoding and a recording medium having a program for a Huffman encoding process recorded thereon for encoding data which has been subjected to discrete cosine transformation into Huffman codes.

2. Description of the Prior Art

Image data includes a huge amount of information. It is therefore impractical to process image data as it is from the viewpoint of the memory capacity required therefor and communication speed. Techniques for compressing image data are therefore important.

One of international standards for image data compression is the JPEG (Joint Photographic Expert Group) standard. JPEG adopts the DCT (discrete cosine transformation) method which involves irreversible encoding and the reversible encoding method which involves DPCM (differential PCM) in a two-dimensional space. The compression of image data according to the DCT method will now be described.

FIG. 7 is a block diagram of a Huffman encoder which performs compression of image data according to the DCT method.

A DCT device 100 performs discrete cosine transformation (hereinafter referred to as "DCT") on original image data input thereto and outputs DCT coefficients. During such DCT, as shown in FIG. 8, image data is divided into a plurality of pixel blocks each having 8×8 pixels. As shown in FIG. 9, one 8×8 pixel block includes 64 items of pixel data $P_{XY}(X, Y=0, \ldots, 7)$. Two-dimensional DCT on an 8×8 pixel block thus divided will provide 64 DCT coefficients $S_{UV}(U, V=0, \ldots, 7)$.

The DCT coefficient $S_{00}$, is referred to as "DC coefficient", and the remaining 63 DCT coefficients are referred to as "AC coefficients". As shown in FIG. 9, the number of horizontal frequency components at high frequencies of a block which has been subjected to DCT is smallest at the left end of the block and is greatest at the right end, and the number of vertical frequency components at high frequencies is smallest at the top of the block and is greatest at the bottom.

A quantizer 110 shown in FIG. 7 quantizes DCT coefficients output by the DCT device 100 as expressed by the following equation using a quantization table consisting of 8×8 quantization coefficients $Q_{UV}(U, V=0, \ldots, 7)$ to output quantized DCT coefficients $\gamma_{UV}(U, V=0, \ldots, 7)$.

$$\gamma_{UV-round}(S_{UV}/Q_{UV}) \qquad (1)$$

where "round" represents a process of rounding a number to the nearest integral number. Image quality and the amount of encoded information are controlled by such quantization. FIG. 10 shows examples of the DCT coefficients output by the quantizer 110. In FIG. 10, "A", "B", "C", "D", "E" and "F" represent values other than "0".

A Huffman encoding portion 120 in FIG. 7 encodes the DCT coefficients $\gamma_{UV}$ output by the quantizer 110 into Huffman codes to output encoded data. Referring to encoding of a DC coefficient, the difference between the DC coefficient of the current block and the DC coefficient of the preceding block is obtained, and the difference is encoded. In this case, differences between DC coefficients are grouped; and a group number SSSS is assigned to each difference; and a Huffman code is assigned to each group number SSSS.

Referring to encoding of AC coefficients, as shown in FIG. 11, the AC coefficients are first arranged on a one-dimensional basis as a result of a zigzag scan. The one-dimensionally arranged AC coefficients are encoded using run lengths NNNN representing the number of consecutive coefficients "0" (invalid coefficients) and the values of coefficients (valid coefficients) other than "0". In this case, the valid coefficients are grouped, and a group number SSSS is assigned to each of the valid coefficients. When an AC coefficient is encoded, a Huffman code is assigned to a combination of the run length NNNN and the group number SSSS.

FIG. 12 shows an example of a table of Huffman codes for DC coefficients. For example, a Huffman code "00" having a code length of 2 is assigned to a DC coefficient difference whose group number SSSS is "0"; a Huffman code "010" having a code length of 3 is assigned to a DC coefficient difference whose group number SSSS is "1"; and a Huffman code "011" having a code length of 3 is assigned to a DC coefficient difference whose group number SSSS is "2".

In the Huffman code table of FIG. 12, a group number SSSS only identifies the group to which a DC coefficient difference belongs. An additional bit is used to identify one of DC coefficients belonging to one group.

FIG. 13 shows an example of a table of Huffman codes for AC coefficients. For example, a Huffman code "1010" having a code length of 4 is assigned to an AC coefficient whose run length/group number combination NNNN/SSSS is "0/0"; a Huffman code "00" having a code length of 2 is assigned to an AC coefficient whose NNNN/SSSS is "0/1"; and a Huffman code "01" having a code length of 2 is assigned to an AC coefficient whose NNNN/SSSS is "0/2".

In the Huffman code table of FIG. 13, a group number SSSS only identifies the group to which a valid coefficient belongs. An additional bit is used to identify one of valid coefficients belonging to one group.

FIG. 14 is a schematic view of an example of a Huffman encoding process in the Huffman encoder according to the related art shown in FIG. 7.

As shown in FIG. 14, DCT coefficients are quantized as expressed by Equation 1 to obtain quantized DCT coefficients $\gamma_{UV}$. In the example shown in FIG. 14, a quantized DCT coefficient $\gamma_{00}$ of "16" is obtained from a DCT coefficient $S_{00}$ of "260" and a quantization coefficient $Q_{00}$ of "16". Similarly, quantized DCT coefficients $\gamma_{01}$=4, $\gamma_{02}$=−2, $\gamma_{10}$=7, $\gamma_{11}$=3, $\gamma_{21}$=−1 and $\gamma_{30}$=−1 are obtained, and other quantized DCT coefficients $\gamma_{UV}$ are 0.

The quantized DCT coefficients $\gamma_{UV}$ are one-dimensionally arranged as a result of a zigzag scan to obtain run lengths representing the number of the coefficients "0" and valid coefficients. The first valid coefficient (DC coefficient) is "16" which is followed by run length/valid coefficient combinations of "0/4", "0/−7", "1/3", "0/−2", "2/−1" and "0/−1", and the last run length is "54".

In order to change the data compression rate of the above-described Huffman encoder according to the related art, the 8×8 quantization coefficients $Q_{UV}$ included in the quantization table must be changed. This makes a process for controlling the data compression rate complicated.

SUMMARY OF THE INVENTION

It is an object of the invention to provide a Huffman encoder, a method for Huffman encoding process, a program for a Huffman encoding process in which a data compression rate can be easily changed and a recording medium having the program for a Huffman encoding process recorded thereon.

A Huffman encoder for encoding a series of data into Huffman codes, according to an aspect of the invention comprises determination means for determining whether each item of a series of data is within a predetermined range and encoding means for performing encoding using combinations of the number of consecutive invalid coefficients and valid coefficients, the invalid coefficients being data among the series of data which are within the predetermined range, the valid coefficients being data out of the predetermined range.

In the Huffman encoder according to the invention, the determination means determines whether each item of a series of data is within a predetermined range. The encoding means treats data among the series of data which are within the predetermined range as invalid coefficients, treats data out of the predetermined range as valid coefficients and performs encoding using combinations of the number of consecutive invalid coefficients and valid coefficients.

In this case, the number of invalid coefficients can be arbitrarily adjusted by changing the predetermined range used by the determination means arbitrarily. This makes it possible to change the data compression rate easily.

In this case, the number of invalid coefficients can be arbitrarily adjusted by changing the predetermined range used by the determination means arbitrarily. This makes it possible to change the data compression rate easily.

The predetermined range can be arbitrarily set to a value larger than 0.

The Huffman encoder may further comprises quantization means for quantizing DCT coefficients using predetermined quantization coefficients and for supplying quantized DCT coefficients to the determination means as a series of data.

In this case, the DCT coefficients quantized by the quantization means using the quantization coefficients are supplied to the determination means as a series of data. Since the number of invalid coefficients can be arbitrarily adjusted by changing the predetermined range used by the determination means arbitrarily, the data compression rate can be easily changed without changing the quantization coefficients of the quantization means.

A Huffman encoder for encoding a series of data into Huffman codes, according to another aspect of the invention comprises a determination circuit for determining whether each item of a series of data is within a predetermined range and an encoding circuit for performing encoding using combinations of the number of consecutive invalid coefficients and valid coefficients, the invalid coefficients being data among the series of data which are within the predetermined range, the valid coefficients being data out of the predetermined range.

In the Huffman encoder according to the invention, the determination circuit determines whether each item of a series of data is within a predetermined range. The encoding circuit treats data among the series of data which are within the predetermined range as invalid coefficients, treats data out of the predetermined range as valid coefficients and performs encoding using combinations of the number of consecutive invalid coefficients and valid coefficients.

A method for Huffman encoding for encoding a series of data into Huffman codes, according to a further aspect of the invention comprises the steps of determining whether each item of a series of data is within a predetermined range and performing Huffman encoding using combinations of the number of consecutive invalid coefficients and valid coefficients, the invalid coefficients being data among the series of data within the predetermined range, the valid coefficients being data out of the predetermined range.

In the method for Huffman encoding according to the invention, it is determined whether each item of a series of data is within a predetermined range; data among the series of data which are within the predetermined range are treated as invalid coefficients; and data out of the predetermined range are treated as valid coefficients. Encoding is performed using combinations of the number of consecutive invalid coefficients and valid coefficients.

In this case, the number of invalid coefficients can be arbitrarily adjusted by changing the predetermined range arbitrarily. This makes it possible to change the data compression rate easily.

The series of data may be obtained by quantizing DCT coefficients using predetermined quantization coefficients.

In this case, the DCT coefficients quantized using the quantization coefficients are provided as a series of data. Since the number of invalid coefficients can be arbitrarily adjusted by changing the predetermined range used by the determination means arbitrarily, the data compression rate can be easily changed without changing the quantization coefficients of the quantization means.

In a recording medium having a processor-readable program for a Huffman encoding process recorded thereon, according to a further aspect of the invention, the program for a Huffman encoding process causes a processor to perform a process of determining whether each item of a series of data is within a predetermined range and a process of performing encoding utilizing combinations of the number of consecutive invalid coefficients and valid coefficients, the invalid coefficients being data among the series of data within the predetermined range, the valid coefficients being data out of the predetermined range.

According to the program for a Huffman encoding process according to the invention, it is determined whether each item of a series of data is within a predetermined range; data among the series of data which are within the predetermined range are treated as invalid coefficients; and data out of the predetermined range are treated as valid coefficients. Encoding is performed using combinations of the number of consecutive invalid coefficients and valid coefficients.

In this case, the number of invalid coefficients can be arbitrarily adjusted by changing the predetermined range arbitrarily. This makes it possible to change the data compression rate easily.

The program for a Huffman encoding process may further causes a processor to perform a process of obtaining a series of data by quantizing DCT coefficients using predetermined quantization coefficients.

In this case, the DCT coefficients quantized using the predetermined quantization coefficients are provided as a series of data. Since the number of invalid coefficients can be arbitrarily adjusted by changing the predetermined range arbitrarily, the data compression rate can be easily changed without changing the quantization coefficients.

A processor-readable program for a Huffman encoding process comprises the steps of causing the processor to perform a process of determining whether each item of a series of data is within a predetermined range and causing the processor to perform a process of performing encoding utilizing combinations of the number of consecutive invalid coefficients and valid coefficients, the invalid coefficients being data among the series of data within the predetermined range, the valid coefficients being data out of the predetermined range.

According to the program for a Huffman encoding process according to the invention, it is determined whether each item of a series of data is within a predetermined range; data among the series of data which are within the predetermined range are treated as invalid coefficients; and data out of the predetermined range are treated as valid coefficients. Encoding is performed using combinations of the number of consecutive invalid coefficients and valid coefficients.

In this case, the number of invalid coefficients can be arbitrarily adjusted by changing the predetermined range arbitrarily. This makes it possible to change the data compression rate easily.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows a table of Huffman codes for AC coefficients used in the Huffman encoder in FIG. 1.

FIG. 12 shows an example of a table of Huffman codes for DC coefficients.

FIG. 13 shows an example of a table of Huffman codes for AC coefficients used in a Huffman encoder according to the related art.

FIG. 14 is a schematic diagram showing an example of a Huffman encoding process in the Huffman encoder according to the related art.

DESCRIPTION OF THE PREFERRED EMBODIMENT

Figure 1:
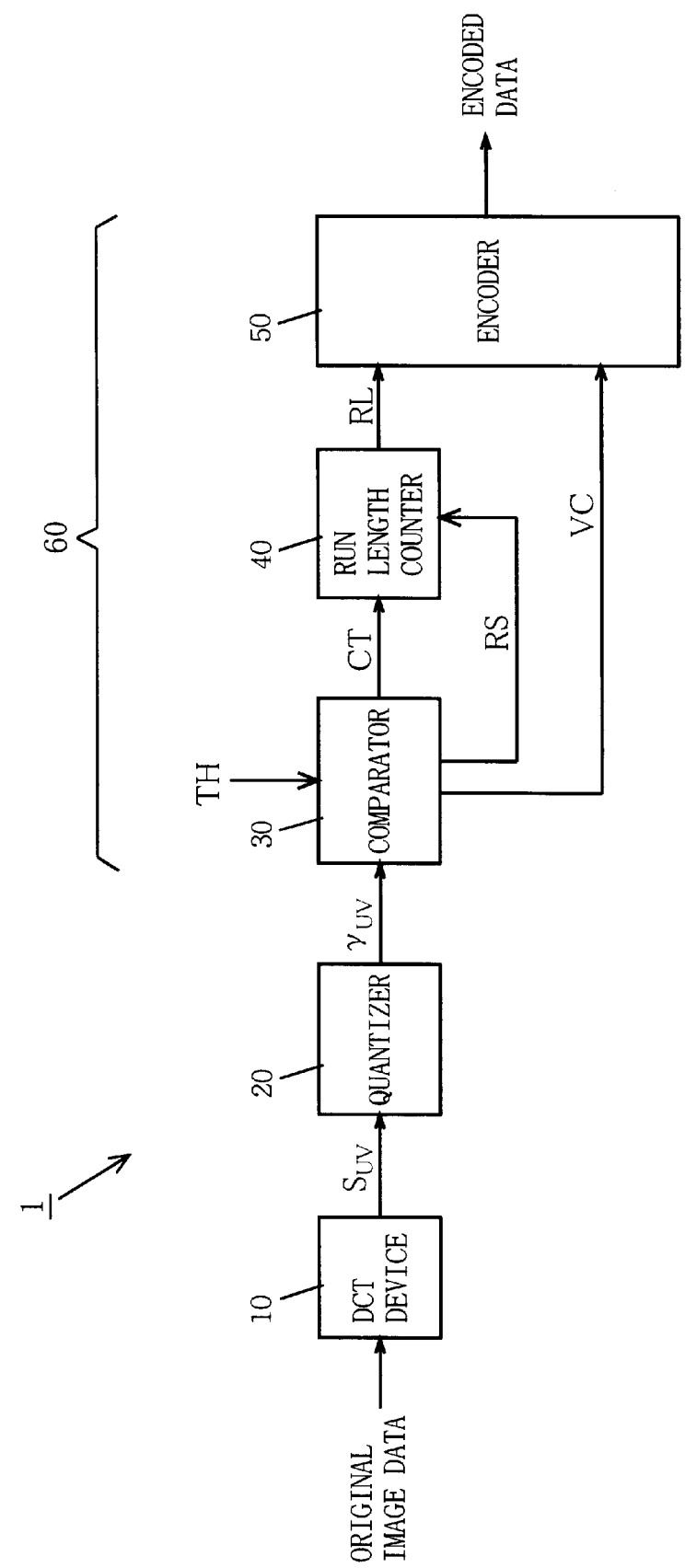
FIG. 1 is a block diagram of a configuration of a Huffman encoder according to a first embodiment of the invention.

FIG. 1 is a block diagram of a configuration of a Huffman encoder according to an embodiment of the invention.

In FIG. 1, a Huffman encoder 1 includes a DCT device 10, a quantizer 20, a comparator 30, a run length counter 40 and an encoder 50. A Huffman encoding portion 60 is formed by the comparator 30, run length counter 40 and encoder 50.

Figure 8:
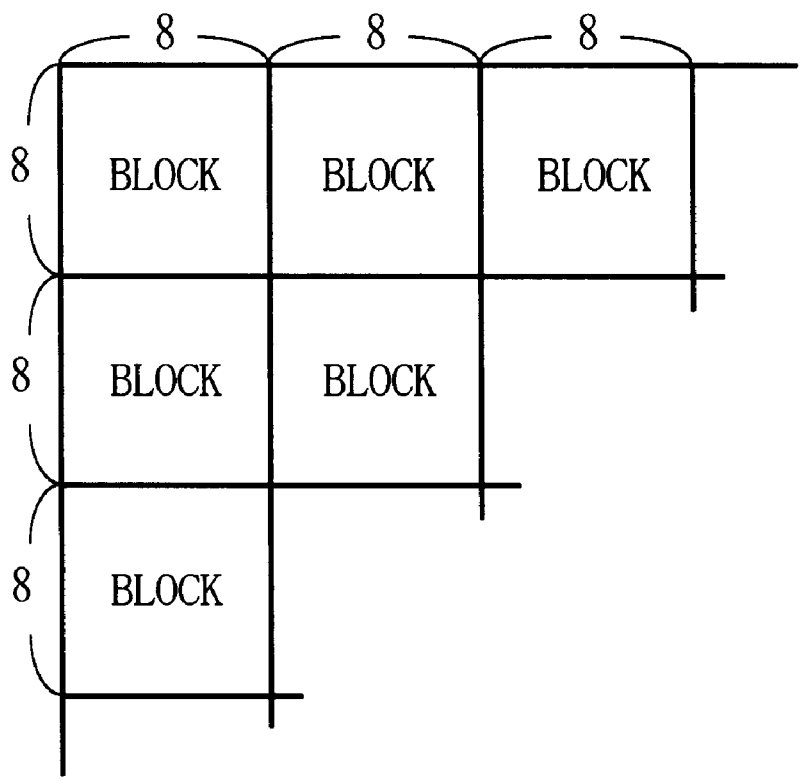
FIG. 8 is a diagram showing the formation of image data blocks.
Figure 9:
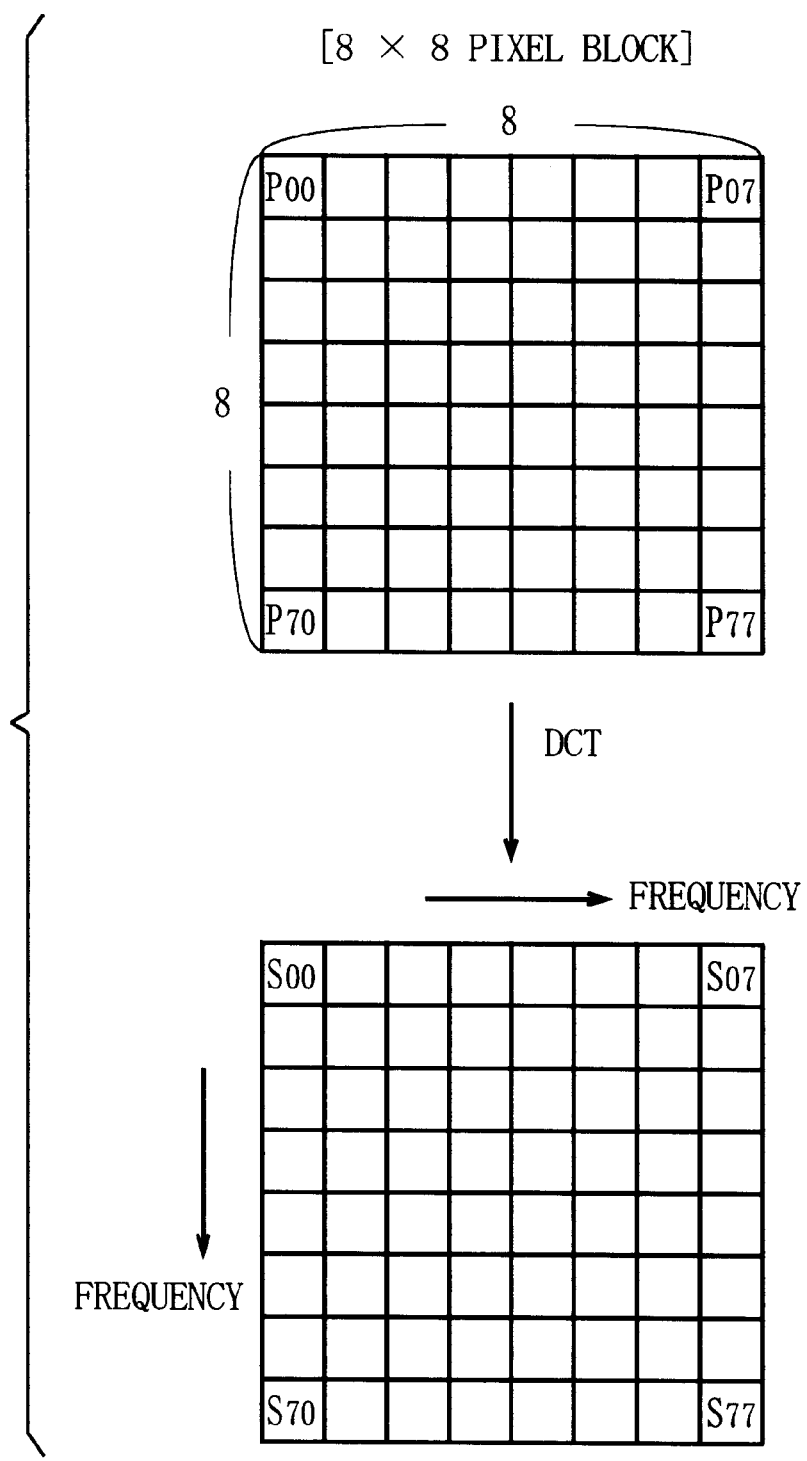
FIG. 9 illustrates an 8×8 pixel block and a block which has been subjected to DCT.
Figure 10:
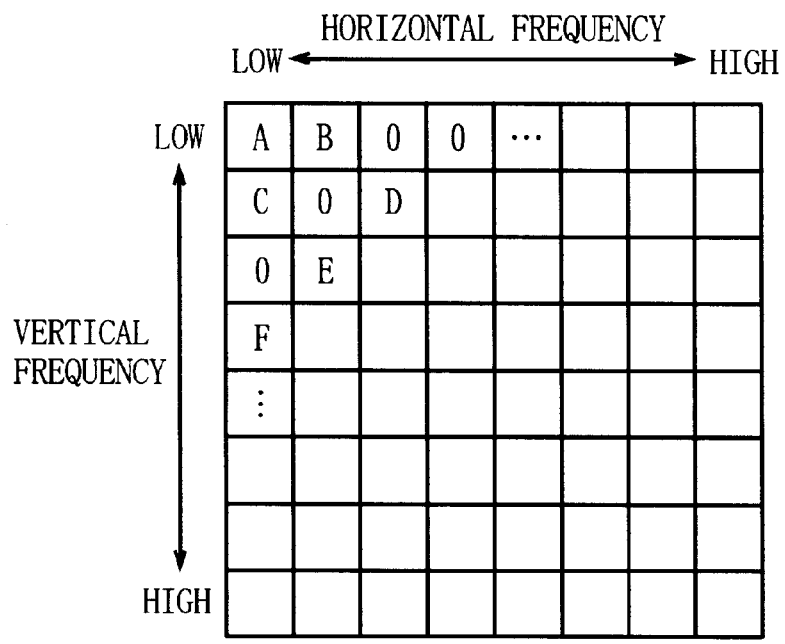
FIG. 10 illustrates examples of quantized DCT coefficients.

The DCT device 10 performs discrete cosine transformation (hereinafter referred to as "DCT") on original image data input thereto and outputs DCT coefficients. During such DCT, as shown in FIG. 8, image data is divided into a plurality of pixel blocks each having 8×8 pixels. As shown in FIG. 9, one 8×8 pixel block includes 64 items of pixel data $P_{XY}$ (X, Y=0, . . . , 7). Two-dimensional DCT on an 8×8 pixel block thus divided will provide 64 DCT coefficients $S_{UV}$ (U, V=0, . . . , 7). As described above, the DCT coefficient $S_{00}$ is referred to as "DC coefficient", and the remaining 63 DCT coefficients are referred to as "AC coefficients".

The quantizer 20 quantizes DCT coefficients $S_{UV}$ output by the DCT device 10 as expressed by the following equation using a quantization table consisting of 8×8 quantization coefficients $Q_{UV}$ (U, V=0, . . . , 7) to output quantized DCT coefficients $\gamma_{UV}$ (U, V=0, . . . , 7).

$$\gamma_{UV} = S_{UV}/Q_{UV} \qquad (2)$$

The quantization in the present embodiment does not involve a process of rounding the result of the calculation of $S_{UV}/Q_{UV}$ into integral numbers. Therefore, the quantized DCT coefficients $\gamma_{UV}$ have fractional values.

An adjustable threshold TH is set in the comparator 30. The comparator 30 determines whether a DCT coefficient $\gamma_{UV}$ output by the quantizer 20 satisfies the following equation.

$$|\gamma_{UV}| \leq TH \qquad (3)$$

When a quantized DCT coefficient $\gamma_{UV}$ satisfies Equation 3, the comparator 30 judges the quantized DCT coefficient $\gamma_{UV}$ to be an invalid coefficient. In this case, the comparator 30 outputs a detection signal CT indicating that an invalid coefficient has been detected. When a quantized DCT coefficient $\gamma_{UV}$ does not satisfy Equation 3, the comparator 30 judges the quantized DCT coefficient $\gamma_{UV}$ to be a valid coefficient. In this case, the comparator 30 rounds the quantized DCT coefficient $\gamma_{UV}$ into the nearest integral number, outputs the rounded integral DCT coefficient as a valid coefficient VC and outputs a reset signal RS. The comparator 30 outputs a reset signal RS also when processing of 8×8 quantized DCT coefficients $\gamma_{UV}$ for one block has been completed.

The run length counter 40 counts detection signals CT output by the comparator 30 and outputs the result of the counting as a run length RL. The run length counter 40 also resets the result of the counting to 0 in response to a reset signal RS output by the comparator 30. A run length RL represents the number of consecutive invalid coefficients, i.e., the number of consecutive DCT coefficients $\gamma_{UV}$ which satisfy Equation 3.

The encoder 50 performs Huffman encoding based on valid coefficients VC output by the comparator 30 and run lengths RL output by the run length counter 40 and outputs encoded data.

Referring to encoding of a DC coefficient, the difference between the DC coefficient of the current block and the DC coefficient of the preceding block is obtained, and the difference is encoded. In this case, differences between DC coefficients are grouped; and a group number SSSS is assigned to each difference; and a Huffman code is assigned to each group number SSSS.

Figure 11:
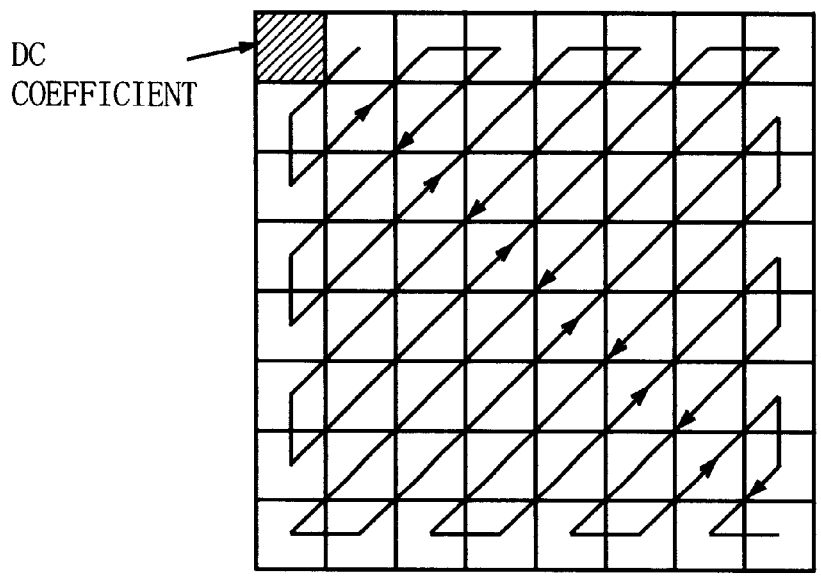
FIG. 11 is a diagram for explaining a zigzag scan.

Referring to encoding of AC coefficients, as shown in FIG. 11, the AC coefficients are first arranged on a one-dimensional basis as a result of a zigzag scan. The one-dimensionally arranged AC coefficients are encoded using the run lengths RL representing the number of consecutive invalid coefficients and the valid coefficients VC. In this case, the valid coefficients are grouped, and a group number SSSS is assigned to each of the valid coefficients. When an AC coefficient is encoded, a Huffman code is assigned to a combination of the run length RL and the group number SSSS.

FIG. 2 shows an example of a table of Huffman codes for AC coefficients used in the Huffman encoder in FIG. 1. For example, a Huffman code "1010" having a code length of 4 is assigned to an AC coefficient whose run length/group combination RL/SSSS is "0/0"; a Huffman code "00" having a code length of 2 is assigned to an AC coefficient whose RL/SSSS is "0/1"; and a Huffman code "01" having a code length of 2 is assigned to an AC coefficient whose RL/SSSS is "0/2".

In the Huffman code table of FIG. 2, a group number SSSS only identifies the group to which a valid coefficient belongs. An additional bit is used to identify one of valid coefficients belonging to one group.

In an actual encoding process, when the last quantized DCT coefficient $\gamma_{77}$ of one block is an invalid coefficient, "EOB (end of block)" is marked immediately after the last valid coefficient to terminate the encoding of that block. No EOB marking is provided when the last quantized DCT coefficient $\gamma_{77}$ of one block is a valid coefficient. When the number of consecutive invalid coefficients in one block exceeds 15, "ZRL" representing the run length RL of 16 consecutive invalid coefficients is marked repeatedly until the remaining run length RL becomes equal to or smaller than 15.

In the present embodiment, the comparator 30 corresponds to the determining means, and the run length counter 40 and encoder 50 constitute the encoding means. The quantizer 20 corresponds to the quantization means.

The DCT device 10, quantizer 20 and Huffman encoding portion 60 of the Huffman encoder in FIG. 1 may be implemented using hardware such as an integrated circuit or may alternatively be implemented using a combination of hardware and software such as a computer.

Figure 3:
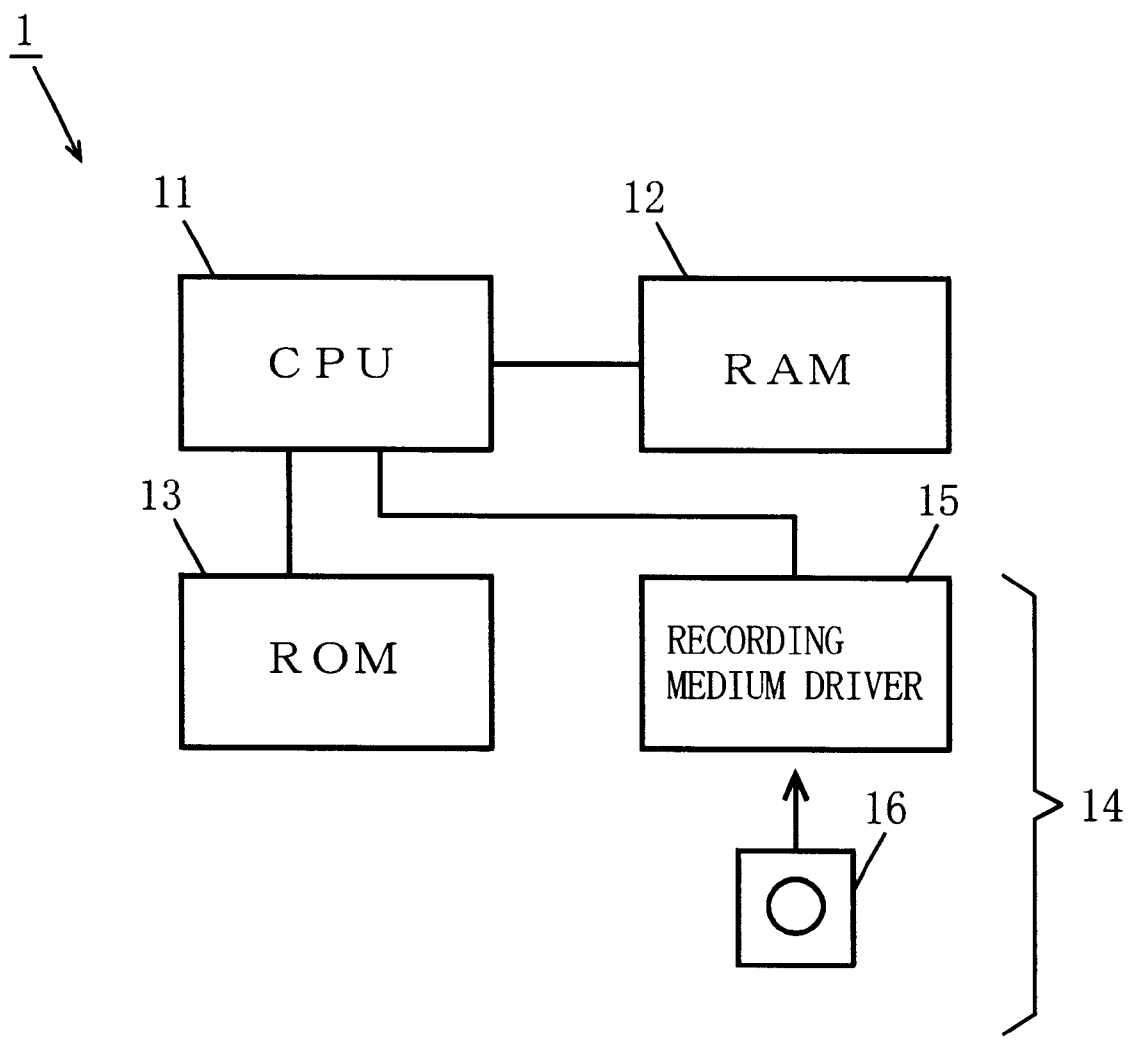
FIG. 3 is a block diagram of a hardware configuration of the Huffman encoder in FIG. 1.

An example of implementation of the Huffman encoder 1 in FIG. 1 using hardware and software will now be described. FIG. 3 is a block diagram of a configuration of hardware of the Huffman encoder 1 in FIG. 1.

The Huffman encoder 1 is formed by a CPU (central processing unit) 11, a RAM (random access memory) 12, a ROM (read only memory) 13 and an external storage device 14. The external storage device 14 is constituted by a recording medium driver 15 such as a hard disk drive, floppy disk drive or CD-ROM drive and a recording medium 16 such as a hard disk, floppy disk or CD-ROM.

A system program is stored in the ROM 13. A program for a Huffman encoding process is recorded on the recording medium 16. The CPU 11 operates in accordance with the system program stored in the ROM 13, reads the program for a Huffman encoding process recorded on the recording medium 16 through the recording medium driver 15 and executes the program for a Huffman encoding process on the RAM 12.

As a result, the DCT process at the DCT device 10, the quantizing process at the quantizer 20 and the encoding process at the Huffman encoding portion 60 in FIG. 1 are executed. The encoding process includes a process of outputting the run lengths RL and valid coefficients VC.

Figure 4:
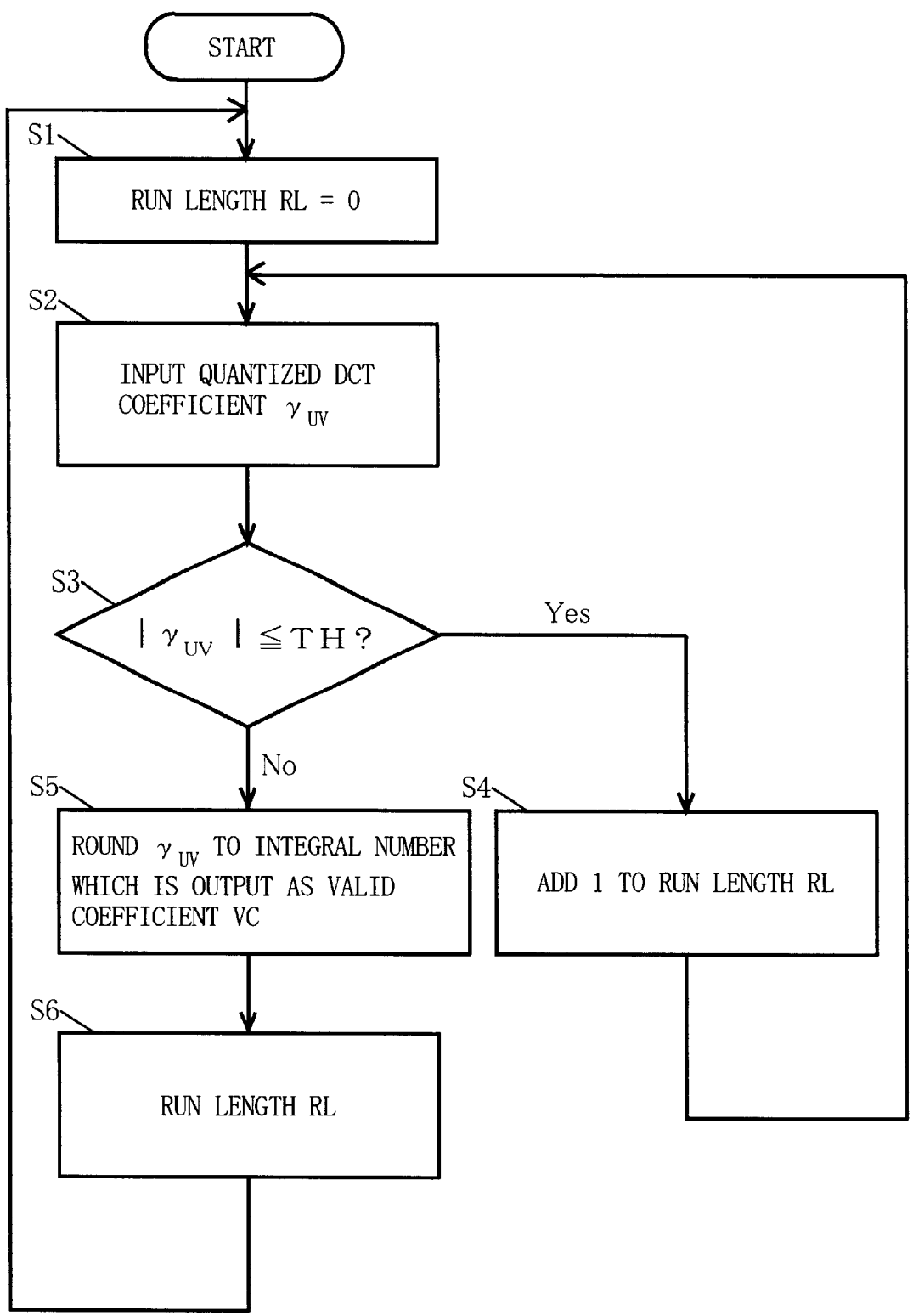
FIG. 4 is a flow chart showing a process of outputting run lengths and valid coefficients in a program for a Huffman encoding process recorded on the recording medium in FIG. 3.

FIG. 4 is a flow chart showing the process of outputting the run lengths RL and valid coefficients VC in the program for a Huffman encoding process recorded on the recording medium 16 in FIG. 3.

First, a run length of 0 is set (step S1). Next, a DCT coefficient $\gamma_{UV}$ quantized by the quantizer 20 is input (step S2). Then, it is determined whether the absolute value of the quantized DCT coefficient $\gamma_{UV}$ is equal to or smaller than the threshold TH (step S3).

When the absolute value of the quantized DCT coefficient $\gamma_{UV}$ is equal to or smaller than the threshold TH, the quantized DCT coefficient $\gamma_{UV}$ is regarded as an invalid coefficient, and the process returns to step S2 after adding 1 to the run length RL (step S4).

When it is determined at step S3 that the absolute value of the quantized DCT coefficient $\gamma_{UV}$ is greater than the threshold TH, the quantized DCT coefficient $\gamma_{UV}$ is rounded to an integral number which is in turn output as a valid coefficient VC (step S5). The current run length RL is also output (step S6). The process then returns to step S1 to execute the processes at steps S1 through S6 on a next quantized DCT coefficient $\gamma_{UV}$.

As described above, in an actual encoding process, when the number of consecutive invalid coefficients in one block exceeds 15, "ZRL" representing the run length RL of 16 consecutive invalid coefficients is repeatedly output until the remaining run length becomes equal to or smaller than 15.

While the program for a Huffman encoding process in the above example is recorded on the recording medium 16 of the external storage device 14, the program for a Huffman encoding process may be stored in the ROM 13, and the CPU 11 may read the program for a Huffman encoding process stored in the ROM 13 to execute it on the RAM 12. Alternatively, a program for a Huffman encoding process received through a communication medium such as a communication line may be executed on the RAM 12. In this case, the communication medium serves as the recording medium.

Figure 5:
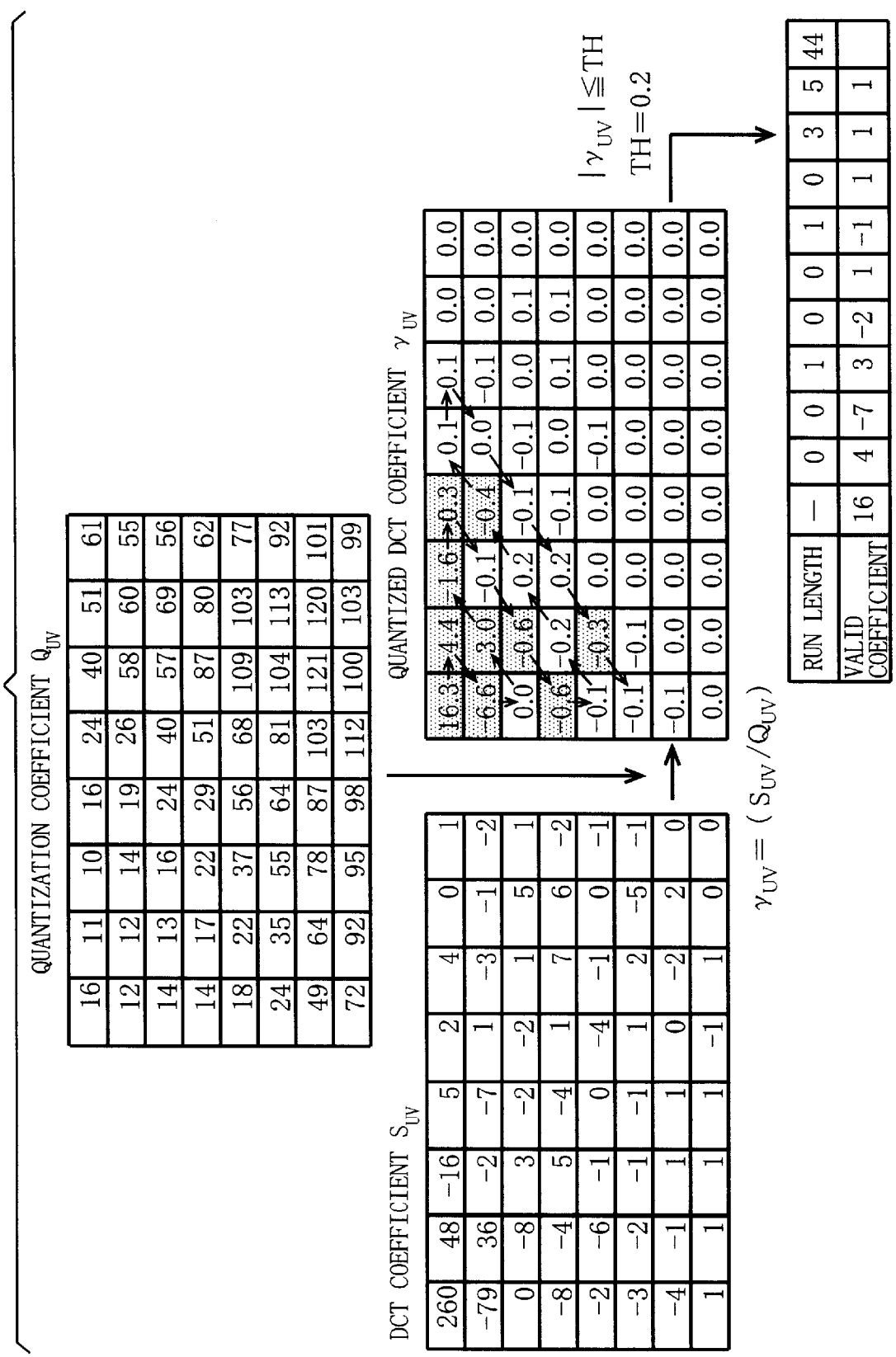
FIG. 5 is a schematic diagram showing an example of a Huffman encoding process in the Huffman encoder in FIG. 1.

FIG. 5 is a schematic diagram of an example of the Huffman encoding process in the Huffman encoder 1 in FIG. 1. In the example in FIG. 5, a threshold TH of 0.2 is set.

As shown in FIG. 5, DCT coefficients $S_{UV}$ are quantized as expressed by Equation 2 to obtain quantized DCT coefficients $\gamma_{UV}$.

In the example shown in FIG. 5, a quantized DCT coefficient $\gamma_{00}$ of "16.3" is obtained from a DCT coefficient $S_{00}$ of "260" and a quantization coefficient $Q_{00}$ of "16". Similarly, quantized DCT coefficients $\gamma_{01}$=4.4, $\gamma_{02}$=−1.6, $\gamma_{03}$=0.3, $\gamma_{10}$=−6.6, $\gamma_{11}$=3.0, $\gamma_{13}$=−0.4, $\gamma_{21}$=−0.6, $\gamma_{30}$=−0.6, and $\gamma_{41}$=−0.3 are obtained. Those quantized DCT coefficients $\gamma_{UV}$ are regarded as valid coefficients because they do not satisfy Equation 3. Other quantized DCT coefficients $\gamma_{UV}$ are regarded as invalid coefficients because they satisfy Equation 3.

The quantized DCT coefficients $\gamma_{UV}$ are one-dimensionally arranged as a result of a zigzag scan to obtain run lengths RL representing the number of the consecutive invalid coefficients that satisfy Equation 3, and the quantized DCT coefficients $\gamma_{UV}$ that do not satisfy Equation 3 are rounded to integral numbers to obtain valid coefficients VC. In this case, a quantized DCT coefficient $\gamma_{UV}$ which becomes "0" when rounded down is rounded up to "1" which is in turn output as a valid coefficient VC. For example, a quantized DCT coefficient $\gamma_{UV}$=0.3 is output as "1".

The first valid coefficient VC (DC coefficient) in the block is "16". No run length RL exists before the first valid coefficient VC. Then, combinations of run lengths RL and valid coefficients VC, i.e., "0/4", "0/−7", "1/3", "0/−2", "0/1", "1/−1", "0/1", "3/1" and "5/1" follow, and the last run length RL is "44". The data compression rate of the example in FIG. 5 is lower than that of the example in FIG. 14.

Figure 6:
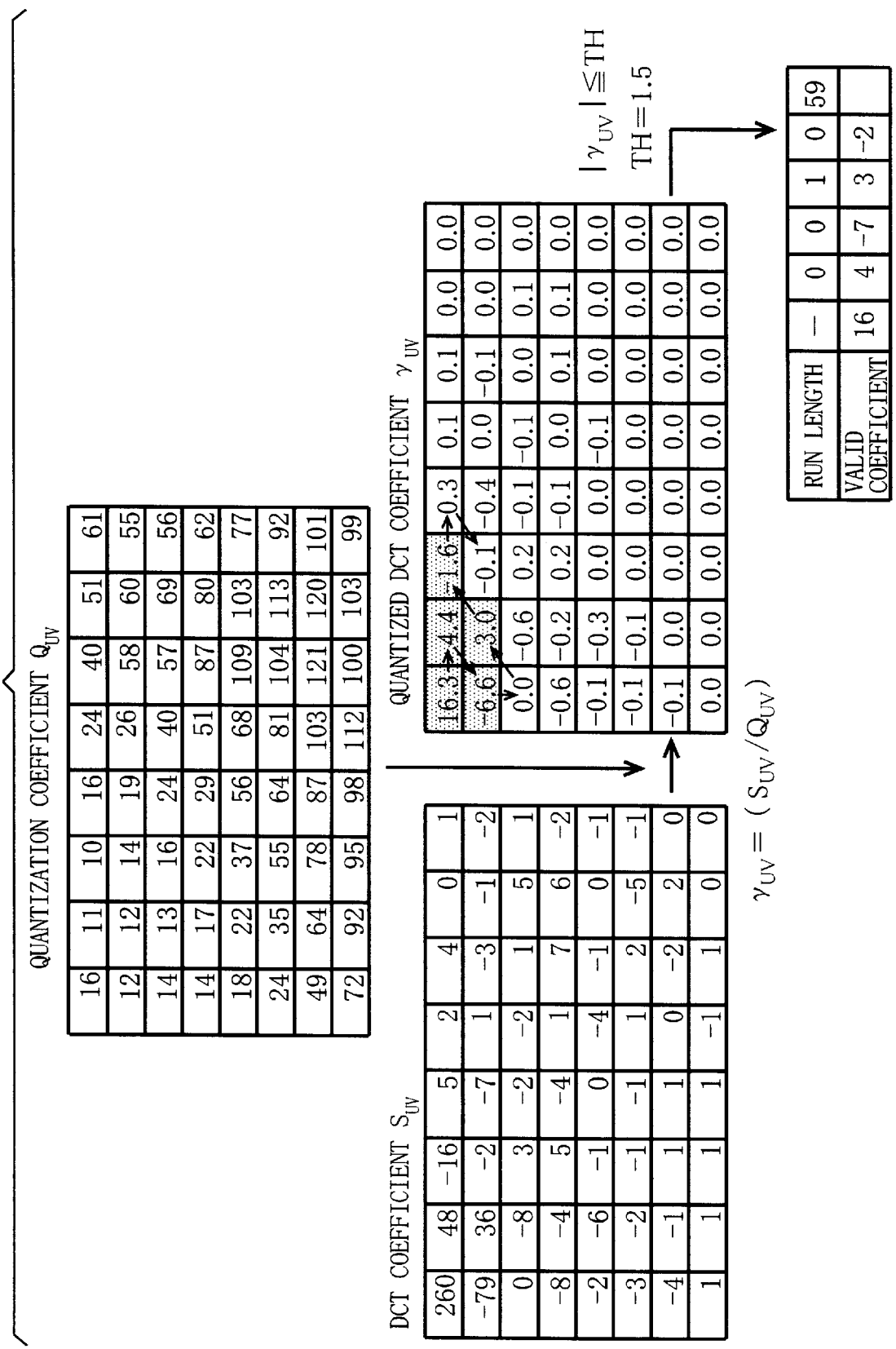
FIG. 6 is a schematic diagram showing another example of the Huffman encoding process in the Huffman encoder in FIG. 1.
Figure 7:
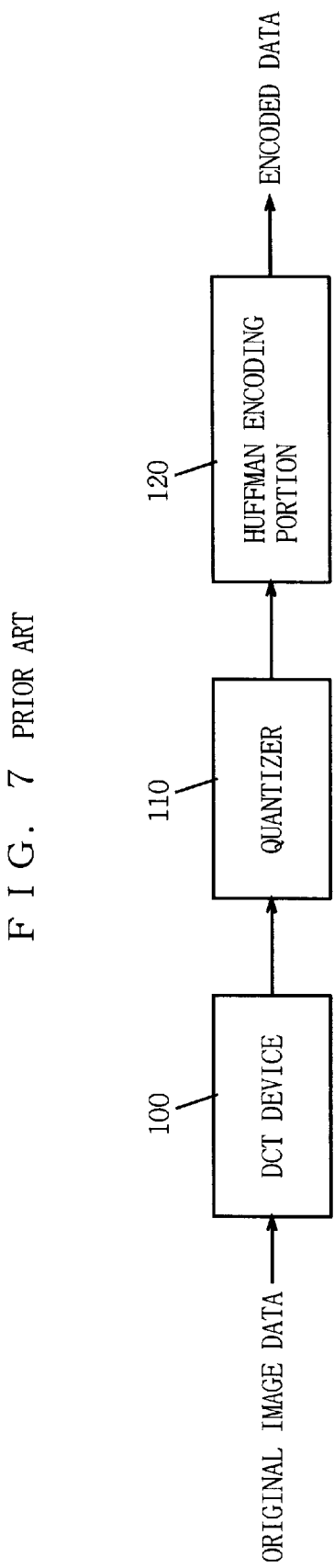
FIG. 7 is a block diagram of a configuration of a Huffman encoder according to the related art.

FIG. 6 is a schematic diagram of another example of the Huffman encoding process in the Huffman encoder 1 in FIG. 1. In the example in FIG. 6, a threshold TH of 1.5 is set.

As shown in FIG. 6, DCT coefficients $S_{UV}$ are quantized as expressed by Equation 2 to obtain quantized DCT coefficients $\gamma_{UV}$.

In the example shown in FIG. 6, a quantized DCT coefficient $\gamma_{00}$ of "16.3" is obtained from a DCT coefficient $S_{00}$ of "260" and a quantization efficient $Q_{00}$ of "16". Similarly, quantized DCT coefficients $\gamma_{01}$=4.4, $\gamma_{02}$=−1.6, $\gamma_{10}$=−6.6 and $\gamma_{11}$=3.0 are obtained, and those quantized DCT coefficients $\gamma_{UV}$ are regarded as valid coefficients because they do not satisfy Equation 3. Other quantized DCT coefficients $\gamma_{UV}$ are regarded as invalid coefficients because they satisfy Equation 3.

The quantized DCT coefficients $\gamma_{UV}$ are one-dimensionally arranged as a result of a zigzag scan to obtain run lengths RL representing the number of the consecutive invalid coefficients that satisfy Equation 3, and the quantized DCT coefficients $\gamma_{UV}$ that do not satisfy Equation 3 are rounded to integral numbers to obtain valid coefficients VC.

The first valid coefficient VC (DC coefficient) in the block is "16". No run length RL exists before the first valid coefficient VC. Then, combinations of run lengths RL and valid coefficients VC, i.e., "0/4", "0/−7", "1/3" and "0/−2" follow, and the last run length RL is "59". The data compression rate of the example in FIG. 6 is higher than that of the example in FIG. 14.

As described above, in the Huffman encoder 1 of the present embodiment, the number of DCT coefficients $\gamma_{UV}$ regarded as invalid coefficients among quantized DCT coefficients $\gamma_{UV}$ output by the quantizer 20 can be arbitrarily adjusted by arbitrarily adjusting the threshold TH, and run lengths RL representing the number of consecutive invalid coefficients can be arbitrarily adjusted. It is therefore possible to change the data compression rate easily without changing the 8×8 quantization coefficients $Q_{UV}$ included in the quantization table.

While a process of rounding the result of calculation of $S_{UV}/Q_{UV}$ to integral numbers is not performed during quantization at the quantizer 20 in the above-described embodiment, a process of rounding the result of calculation of $S_{UV}/Q_{UV}$ to integral numbers as expressed by Equation 1 may be performed during the quantization.

In the above-described embodiment, a quantized DCT coefficient $\gamma_{UV}$ is regarded as an invalid coefficient when the absolute value of the DCT coefficient $\gamma_{UV}$ is equal to or smaller than a threshold TH. However, the range for quantized DCT coefficients $\gamma_{UV}$ regarded as invalid coefficients may be set at any value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A Huffman encoder for encoding a series of data into Huffman codes, comprising:
   determination means for determining whether each item of a series of data is within a predetermined range; and
   encoding means for performing encoding using combinations of the number of consecutive invalid coefficients and valid coefficients, the invalid coefficients being data among said series of data which are within said predetermined range, the valid coefficients being data out of said predetermined range.

2. The Huffman encoder according to claim 1, further comprising quantization means for quantizing DCT coefficients using predetermined quantization coefficients and for supplying quantized DCT coefficients to said determination means as said series of data.

3. The Huffman encoder according to claim 1, wherein
   said predetermined range is a range from a negative threshold value to a positive threshold value.

4. The Huffman encoder according to claim 1, wherein
   said determination means includes comparing means for comparing an absolute value of said each item of a series of data with a threshold value for determining whether said each item of a series of data is within a predetermined range.

5. A Huffman encoder for encoding a series of data into Huffman codes, comprising:
   a determination circuit for determining whether each item of a series of data is within a predetermined range; and
   an encoding circuit for performing encoding using combinations of the number of consecutive invalid coefficients and valid coefficients, the invalid coefficients being data among said series of data which are within said predetermined range, the valid coefficients being data out of said predetermined range.

6. The Huffman encoder according to claim 5, further comprising quantizer quantizing DCT coefficients using predetermined quantization coefficients and for supplying quantized DCT coefficients to said determination circuit as said series of data.

7. The Huffman encoder according to claim 5, wherein
   said predetermined range is a range from a negative threshold value to a positive threshold value.

8. The Huffman encoder according to claim 5, wherein said determination circuit includes a comparator for comparing an absolute value of said each item of a series of data with a threshold value for determining whether said each item of a series of data is within a predetermined range.

9. A method for Huffman encoding for encoding a series of data into Huffman codes, comprising the steps of:
   determining whether each item of a series of data is within a predetermined range; and
   performing Huffman encoding using combinations of the number of consecutive invalid coefficients and valid coefficients, the invalid coefficients being data among said series of data within said predetermined range, the valid coefficients being data out of said predetermined range.

10. The method for Huffman encoding according to claim 9, wherein said series of data are obtained by quantizing DCT coefficients using predetermined quantization coefficients.

11. The method for Huffman encoding according to claim 9, wherein
    said predetermined range is a range from a negative threshold value to a positive threshold value.

12. The method for Huffman encoding according to claim 9, wherein said step of determining includes comparing an absolute value of said each item of a series of data with a threshold value for determining whether each item of a series of data is within a predetermined range.

13. A recording medium having a processor-readable program for a Huffman encoding process recorded thereon, wherein said program for a Huffman encoding process causes said processor to perform a process of determining whether each item of a series of data is within a predetermined range and a process of performing encoding utilizing combinations of the number of consecutive invalid coefficients and valid coefficients, the invalid coefficients being data among said series of data within said predetermined range, the valid coefficients being data out of said predetermined range.

14. The recording medium having a program for a Huffman encoding process recorded thereon according to claim 13, wherein said program for a Huffman encoding process further causes said processor to perform a process of obtaining said series of data by quantizing DCT coefficients using predetermined quantization coefficients.

15. The recording medium having a program for a Huffman encoding process recorded thereon according to claim 13, wherein said predetermined range is a range from a negative threshold value to a positive threshold value.

16. The recording medium having a program for a Huffman encoding process recorded thereon according to claim 13, wherein said program causes said processor to perform a process of comparaing an absolute value of said each item of a series of data with a threshold value for determining whether each item of a series of data is within a predetermined range.

17. A processor-readable program for a Huffman encoding process comprising the steps of:

causing said processor to perform a process of determining whether each item of a series of data is within a predetermined range; and causing said processor to perform a process of performing encoding utilizing combinations of the number of consecutive invalid coefficients and valid coefficients, the invalid coefficients being data among said series of data within said predetermined range, the valid coefficients being data out of said predetermined range.

18. The program for a Huffman encoding process according to claim 17, wherein said program for a Huffman encoding process further comprising the steps of causing said processor to perform a process of obtaining said series of data by quantizing DCT coefficients using predetermined quantization coefficients.

19. The program for a Huffman encoding process according to claim 17, wherein said predetermined range is a range from a negative threshold value to a positive threshold value.

20. The program for a Huffman encoding process according to claim 17, wherein said step of causing said processor to perform a process of determining includes comparing an absolute value of said each item of a series of data with a threshold value for determining whether each item of a series of data is within a predetermined range.

21. The Huffman encoder according to claim 1, wherein said encoding means comprises means for determining the number of consecutive invalid coefficients.

22. The Huffman encoder according to claim 5, wherein said encoding circuit comprises a run length counter configured to determine the number of consecutive invalid coefficients.

23. The method according to claim 9, wherein said performing Huffman encoding step includes determining the number of consecutive invalid coefficients.

24. The recording medium according to claim 13, wherein said program for a Huffman encoding process further causes said processor to determine the number of consecutive invalid coefficients.

25. The program according to claim 17, wherein said process of performing encoding further comprises the step of determining the number of consecutive invalid coefficients.

* * * * *